(12) United States Patent
Chae

(10) Patent No.: US 7,394,300 B2
(45) Date of Patent: Jul. 1, 2008

(54) ADJUSTABLE DELAY CELLS AND DELAY LINES INCLUDING THE SAME

(75) Inventor: Kwan-Yeob Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 77 days.

(21) Appl. No.: 11/431,448

(22) Filed: May 10, 2006

(65) Prior Publication Data
US 2007/0069791 A1    Mar. 29, 2007

(30) Foreign Application Priority Data
Sep. 27, 2005   (KR) ............... 10-2005-0089944

(51) Int. Cl.
*H03H 11/26* (2006.01)
(52) U.S. Cl. ............... 327/261; 327/263; 327/264
(58) Field of Classification Search ............ None
See application file for complete search history.

(56) References Cited

U.S. PATENT DOCUMENTS

| | | | |
|---|---|---|---|
| 6,236,695 B1 * | 5/2001 | Taylor ............ | 375/372 |
| 6,417,714 B1 * | 7/2002 | Biyabani et al. ..... | 327/278 |
| 6,424,178 B1 * | 7/2002 | Harrison ........... | 326/93 |

FOREIGN PATENT DOCUMENTS

| | | |
|---|---|---|
| JP | 10-173497 | 6/1998 |
| JP | 10-190423 | 7/1998 |
| JP | 2001-144591 | 5/2001 |
| JP | 2002152018 A | 5/2002 |

OTHER PUBLICATIONS

Notice to Submit Response in Korean Patent Application 10/2005-0089944; dated Aug. 31, 2006.
English Translation of Notice to Submit Response in Korean Patent Application 10/2005-0089944; dated Aug. 31. 2006.

* cited by examiner

*Primary Examiner*—N. Drew Richards
*Assistant Examiner*—An T. Luu
(74) *Attorney, Agent, or Firm*—Myers Bigel Sibley & Sajovec

(57) ABSTRACT

Delay lines include an adjustable delay cell that adjusts a speed at which an input signal to the adjustable delay cell is transmitted through the adjustable delay cell responsive to a control signal. A plurality of set delay cells are coupled in series with the adjustable delay cell that delay transmission through the set delay cells of an input signal to the respective set delay cells an amount that does not vary responsive to the control signal. Delay cells that have an adjustable delay time are also provided.

14 Claims, 9 Drawing Sheets

US 7,394,300 B2

ADJUSTABLE DELAY CELLS AND DELAY LINES INCLUDING THE SAME

CROSS-REFERENCE TO RELATED APPLICATIONS

This application is related to and claims priority from Korean Patent Application No. 10-2005-0089944, filed on Sep. 27, 2005, in the Korean Intellectual Property Office, the disclosure of which is hereby incorporated by reference herein in its entirety.

BACKGROUND OF THE INVENTION

The present invention relates to delay circuits and, more particularly, to delay line circuits having an adjustable delay step and a delay cell for the same.

A delay line is a circuit that is used to delay transmission of a signal, such as a clock signal, for a desired amount of time, and is typically constructed by connecting a plurality of delay cells in series. The accuracy of the delay provided is generally tightly controlled to assure proper circuit operation in high data rate devices, such as a Double Data Rate (DDR) random access memory (RAM). Generally, the higher the operating speed of a DDR RAM, the smaller the delay step or the step size of each delay cell must be. As such, where a greater the number of delay cells ate included in the delay line, a corresponding greater number of bits of a signal controlling the delay cells are provided. Accordingly, the delay step of the delay line generally must be more accurately adjusted for such an application.

SUMMARY OF EMBODIMENTS OF THE INVENTION

Some embodiments of the present invention provide delay lines including an adjustable delay cell that adjusts a speed at which an input signal to the adjustable delay cell is transmitted through the adjustable delay cell responsive to a control signal. A plurality of set delay cells are coupled in series with the adjustable delay cell that delay transmission through the set delay cells of an input signal to the respective set delay cells an amount that does not vary responsive to the control signal. Delay cells that have an adjustable delay time are also provided.

In other embodiments, the adjustable delay cell is a first delay cell of the delay line and an output of the adjustable delay cell is provided as a next input signal to a first of the plurality of set delay cells. The plurality of set delay cells delay the next input signal received from the adjustable delay cell for a predetermined length of time and output the delayed signal.

In further embodiments, the adjustable delay cell includes a buffer that adjusts the speed at which the input signal to the adjustable delay cell is transmitted responsive to the control signal and a multiplexer. The multiplexer selects and outputs an output of the buffer or a second input signal responsive to a select signal. The buffer may include a first inverter that inverts the input signal to the adjustable delay cell, a driver and a second inverter. The driver receives the input signal to the adjustable delay cell and outputs a signal having the same value as a value of the inverted signal output from the first inverter when activated by the control signal. The second inverter has an input coupled to the output signal of the driver and the signal output from the first inverter and inverts the input signal of the second inverter. The output signal of the second inverter is generated at a rate that is greater when the driver is activated by the control signal. The control signal may include a plurality of bits and the buffer may include a plurality of drivers connected to respective ones of the plurality of bits of the control signal.

In other embodiments, the driver includes a third inverter and a switch. The third inverter receives the input signal to the adjustable delay cell and outputs the signal having the same value as the value of the signal output from the first inverter. The switch activates the third inverter responsive to the control signal to activate the driver. A length of time required to transmit the input signal to the adjustable delay cell through the adjustable delay cell is greater when the driver is not activated than when the driver is activated. The switch may include a PMOS transistor having a control gate coupled to the control signal and an NMOS transistor having a control gate coupled at an inverted signal of the control signal.

In further embodiments, the control signal includes a plurality of bits and the buffer includes a plurality of drivers connected to respective ones of the plurality of bits of the control signal. Each of the plurality of drivers inverts the input signal to the adjustable delay cell and outputs the inverted signal responsive to its respective one of the bits of the control signal. The buffer may further include a first inverter that inverts the input signal to the adjustable delay cell and outputs the inverted signal to an inversion output node and a second inverter that inverts the signal on the inversion output node. Each of the plurality of drivers may include a first transistor and a second transistor connected in series between a first supply voltage source and the inversion output node and a third transistor and a fourth transistor connected in series between the inversion output node and a second supply voltage source. The first and fourth transistors may be activated responsive to the input signal to the adjustable delay cell and the second and third transistors may be activated responsive to each drivers respective one of the plurality of bits of the control signal. The second supply voltage may be a ground reference.

In yet other embodiments, the adjustable delay cell includes a buffer that buffers the input signal to the adjustable delay cell and a multiplexer. The multiplexer selects and outputs an output of the buffer or a second input signal responsive to a select signal. The multiplexer further adjusts the speed at which the input signal to the adjustable delay cell is transmitted responsive to the control signal.

In further embodiments, delay cells are provided including a buffer and a multiplexer. The buffer adjusts a length of time required to transmit an input signal of the delay cell through the delay cell responsive to a control signal. The multiplexer selects and outputs an output of the buffer or a second input signal responsive to a select signal. The buffer in some embodiments of the delay cell, the delay cell may be an adjustable delay cell as described previously with reference to delay line embodiments of the present invention.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF EMBODIMENTS OF THE INVENTION

Figure 1:
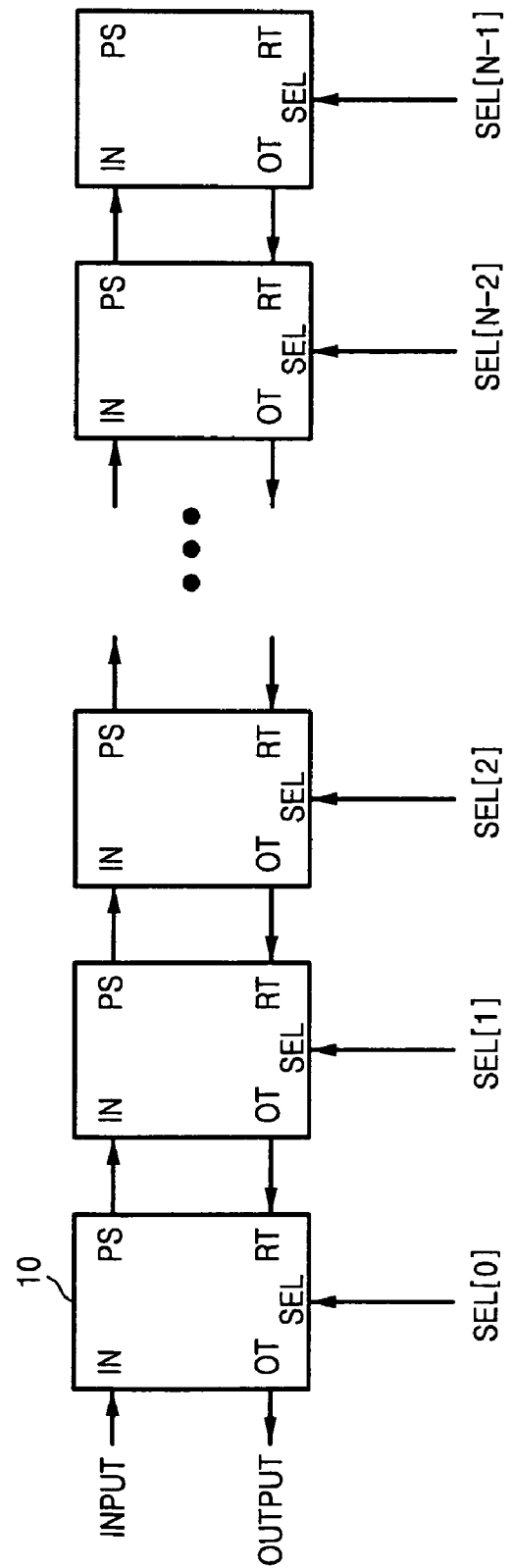
FIG. 1 is a block diagram of a conventional delay line.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a conventional delay line. Referring to FIG. 1, the illustrated delay line includes a plurality serially connected delay cells 10, which may have the same operating conditions/characteristics. A signal SEL [N−1:0] having N bits, corresponding to the number of the delay cells, is used to control the delay line. The signal SEL [N−1:0] has one-hot data, in other words one bit of the signal is set to '1' while the other bits are set to '0'. When a value of 0 is input to a SEL terminal of a delay cell, data transmission occurs, and when a value of 1 is input to a SEL terminal of a delay cell, data return occurs, in which data is output in the reverse direction from when data is transmitted.

Figure 2:
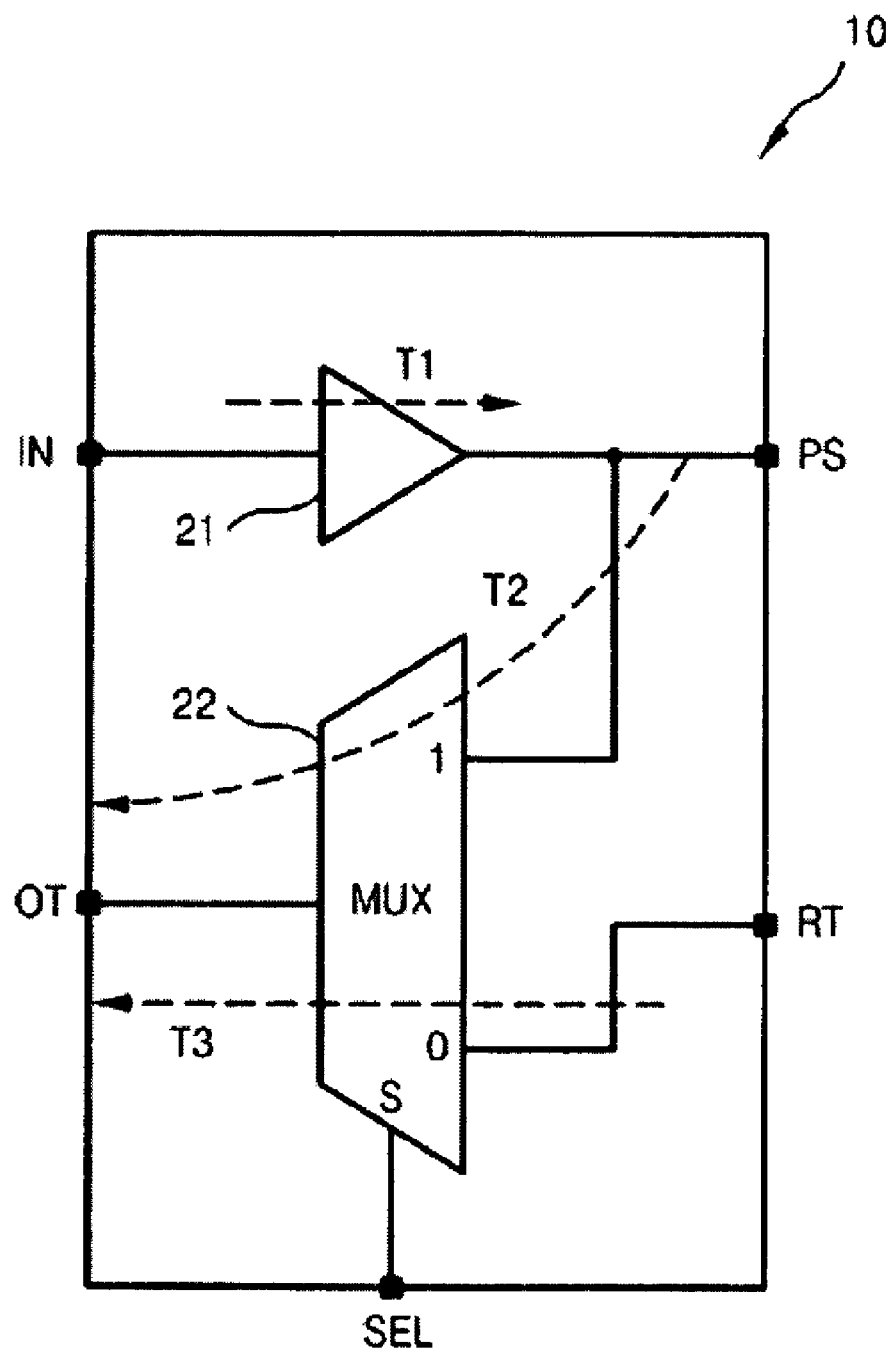
FIG. 2 is a circuit diagram of the delay cell illustrated in FIG. 1.

FIG. 2 is an internal circuit diagram of the delay cell 10 illustrated in FIG. 1. The delay cell 10 includes a buffer 21 and a multiplexer 22. The delay cell 10 also includes a plurality of terminals IN, PS, RT, and OT, through which data is supplied and output, and a control terminal SEL, through which a control signal is supplied.

The multiplexer 22 transmits or returns input data according to data input to the SEL terminal. When a value of 0 is input to the SEL terminal, data input to the IN terminal is transmitted to the PS terminal, and data input to the RT terminal is transmitted to the OT terminal. When a value of 1 is input to the SEL terminal, data input to the IN terminal is transmitted to the OT terminal via the buffer 21. Furthermore, if a value of 0 is input to the SEL terminal, a step delay in the delay cell 10 is T step, computed by combining a delay T1 from the IN terminal to the PS terminal and a delay T3 from the RT terminal to the OT terminal. If a value of 1 is input to the SEL terminal, assuming that a length of time T2 required to transmit data from the PS terminal to the OT terminal is equal to the delay T3, the length of time T2 and the delay T1 are combined to obtain T step. Accordingly, in the conventional delay line illustrated in FIG. 1, a signal input to the IN terminal is output from the OT terminal after a delay from T step to T step×N according to the value SEL[N−1:0] of the control signal.

Figure 3:
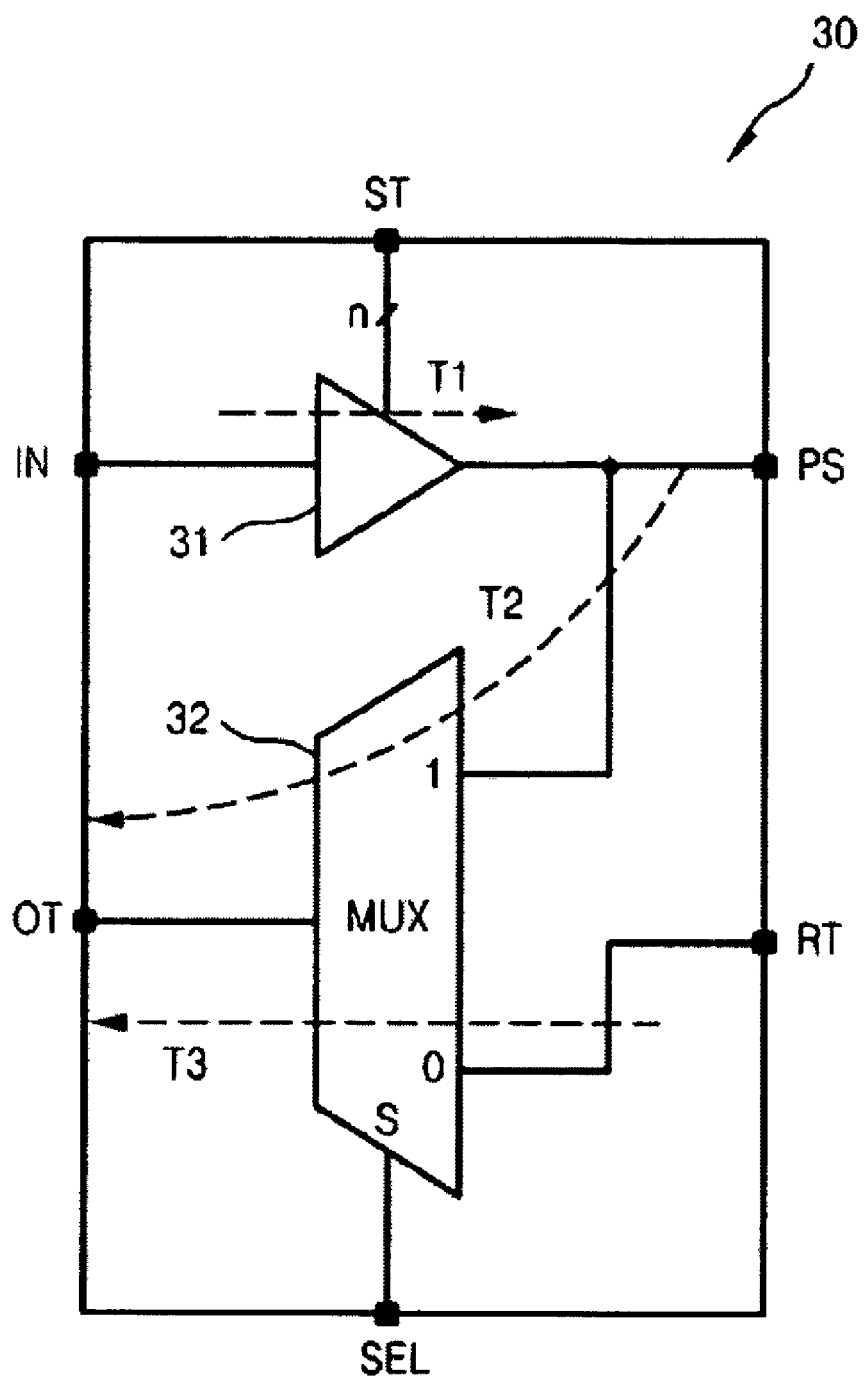
FIG. 3 is a circuit diagram of a delay cell according to some embodiments of the present invention.

FIG. 3 is a circuit diagram of a delay cell 30 according to some embodiments of the present invention. Referring to FIG. 3, the delay cell 30 includes a buffer 31 and a multiplexer 32. The delay cell 30 also includes terminals IN, PS, RT, and OT, through which data is supplied and output, a direction selection terminal SEL that controls a direction in which data is transmitted, and a control terminal ST that controls a step delay.

A step delay in the delay cell 30 is changed according to a value input to the ST terminal. In some embodiments where a 1-bit signal is input to the ST terminal, when a value of 0 is input to the ST terminal, a T step is T1+T2 or T1+T3 according to a value input to the SEL terminal. If a value of 1 is input to the ST terminal, a T step is T1+T2 or T1+T3 according to a value input to the SEL terminal and a step delay is T step×3/2. In this case, 3/2 may vary according to the sizes of elements of the delay cell 30, and the sizes of the elements may be determined by a step delay desired.

Figure 4A:
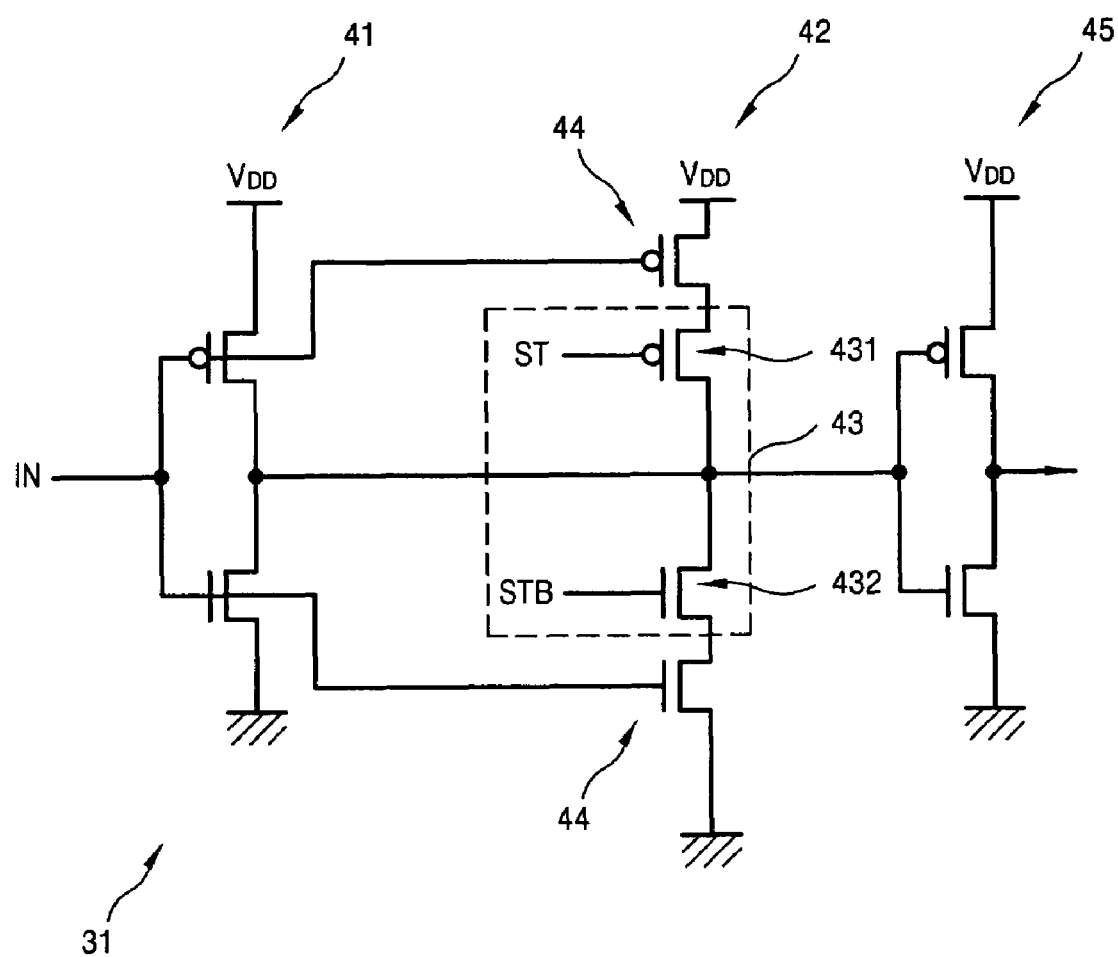
FIG. 4A is a detailed circuit diagram of the buffer illustrated in FIG. 3 according to some embodiments of the present invention.

FIG. 4A is a detailed circuit diagram of the buffer 31 illustrated in FIG. 3 according to some embodiments of the present invention. The buffer 31 illustrated in FIG. 4A is shown as including a plurality of CMOS transistors for illustrative purposes, but the present invention is not limited to such CMOS transistor implementations.

The buffer 31 in the embodiments of FIG. 4A includes a driver 42 in combination with a buffer including a first inverter 41 and a second inverter 45. The illustrated driver 42 includes a CMOS inverter 44 and a CMOS transistor 43. The CMOS transistor 43 is a switching unit that supplies a signal ST to a PMOS transistor 431 and an inverted signal STB of the signal ST to an NMOS transistor 432.

The operation of the buffer 31 illustrated in FIG. 4A is substantially the same as that of a conventional buffer having the first and second inverters 41 and 45, when input data IN is applied. The CMOS transistor 43 is turned on or off to enable or disable the driver 42 in response to the signal ST. The driving speed of the second inverter 45 is changed depending on whether the driver 42 operates. That is, when the signal ST has a value of 0, the CMOS transistor 43 is turned on to enable the driver 42, thus driving the second inverter 45 by the first inverter 41 and the driver 42. However, if the signal ST has a value of 1, the CMOS transistor 43 is turned off to disable the driver 42, thus driving the second inverter 45 only by the first inverter 41. The driving speed of the second inverter 45 when the signal ST has a value of 1 is slower than when the signal ST has a value of 0. Therefore, a step delay in data transmission is changed according to the driving speed in each case. A circuit step delay can be calibrated by adjusting the sizes of the transistors constituting the first inverter 41 and the driver 42. In some embodiments of the present invention, the sizes of the transistors are adjusted so that a step delay when the signal ST has a value of 1 is 1.5 (3/2) times greater than when the signal ST has a value of 0.

In embodiments where the number of bits (bit number) of the signal input to the ST terminal is greater than 1, the buffer 31 may be include a plurality of drivers, such as the driver 42 illustrated in FIG. 4A, added in parallel to a conventional buffer including the inverters 41, 45.

$n^{th}$ drivers 321 through 32n in combination with a conventional buffer including a first inverter 41 and a second inverter 45.

The first driver 321 includes PMOS transistors P11 and P21 connected in series between a supply voltage source VDD and an inversion output node 331, and NMOS transistors N21 and N11 connected in series between the inversion output node 331 and a ground voltage reference. The nth driver 32n includes PMOS transistors P1n and P2n connected in series between the supply voltage source VDD and the inversion output node 331, and NMOS transistors N21 and N1n connected in series between the inversion output node 331 and the ground voltage reference. The drivers 321 through 32n may each be configured substantially as described for the driver 42 illustrated in FIG. 4A, and thus, a detailed description of the drivers and their operation will be omitted.

Each of the drivers 321 through 32n in the illustrated embodiments operates in response to a corresponding bit of a signal ST comprised of a plurality of bits (n bits, where n is a natural number equal to or greater than 2). For example, the first driver 321 is turned on or off in response to a least significant bit ST[1] of the signal ST and an inverted bit STB[1] of the least significant bit ST[1], and the $n^{th}$ driver 32n is turned on or off in response to a most significant bit ST[n] of the signal ST and an inverted bit STB[n] of the most significant bit ST[n].

If the least significant bit ST[1] of the signal ST is 0, the PMOS transistor P21 and the NMOS transistor N21 of the first driver 321 are turned on to enable the first driver 321. If the least significant bit ST[1] of the signal ST is 1, the PMOS transistor P21 and the NMOS transistor N21 of the first driver 321 are turned off to disable the first driver 321.

If the most significant bit ST[n] of the signal ST is 0, the PMOS transistor P2n and the NMOS transistor N2n of the $n^{th}$ driver 32n are turned on to enable the $n^{th}$ driver 32n. If the most significant bit ST[n] of the signal ST is 1, the PMOS transistor P2n and the NMOS transistor N2n of the $n^{th}$ driver 32n are turned off to disable the $n^{th}$ driver 32n.

As described above, each of the drivers 321 through 32n may be selectively enabled or disabled in response to a corresponding bit of the multi-bit signal ST (having n bits, where n is a natural number equal to or greater than 2). The greater the number of the drivers enabled, the higher the driving speed. Therefore, the driving speed is changed according to a combination of the bits of the signal ST, and a step delay in data transmission is changed according to the selected driving speed.

Table 1 shows examples of a step delay with respect to an input value according to a bit number of the signal ST.

TABLE 1

| ST number | conventional delay cell | delay cell according to some embodiments of the present invention | | | | | |
|---|---|---|---|---|---|---|---|
| of bits | X | 1 | | 2 | | | |
| ST | X | 0 | 1 | 00 | 01 | 10 | 11 |
| T1 + T2 | T step | T step | T step × 3/2 | T step | T step × 5/4 | T step × 6/4 | T step × 7/4 |
| T1 + T3 | T step | T step | T step × 3/2 | T step | T step × 5/4 | T step × 6/4 | T step × 7/4 |

Figure 4B:
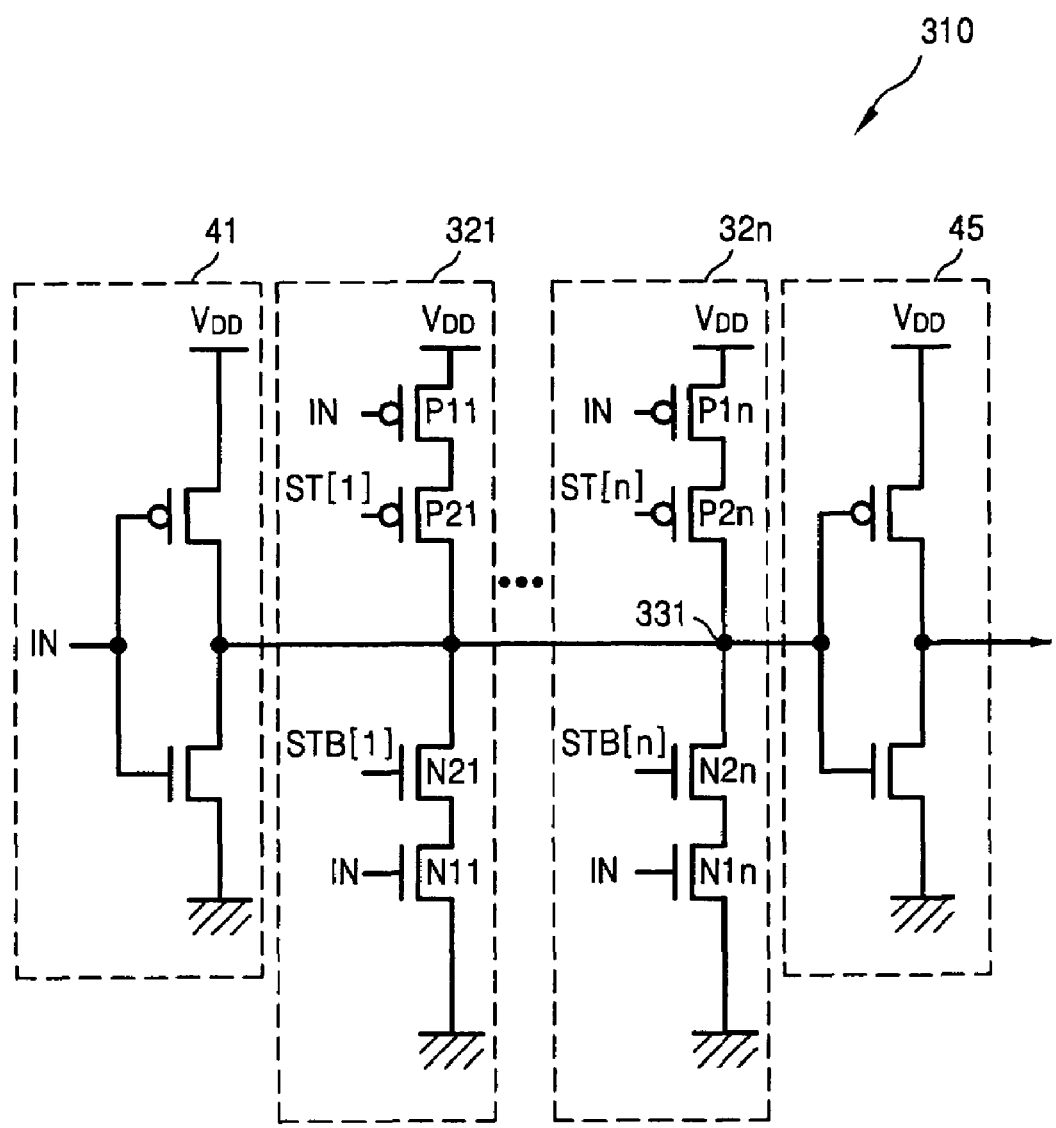
FIG. 4B is a detailed circuit diagram of the buffer illustrated in FIG. 3 according to other embodiments of the present invention.

FIG. 4B is a detailed circuit diagram of a buffer 310 according to some embodiments of the present invention. Referring to FIG. 4B, the buffer 310 includes a plurality of first through As described above, a step delay in the delay cell 30 of FIG. 3 may be controlled by applying the control signal ST to the buffer 31. In some embodiments, a step delay may be controlled by applying the control signal ST to the multiplexer 32 instead of or in addition to the buffer 31.

Figure 5:
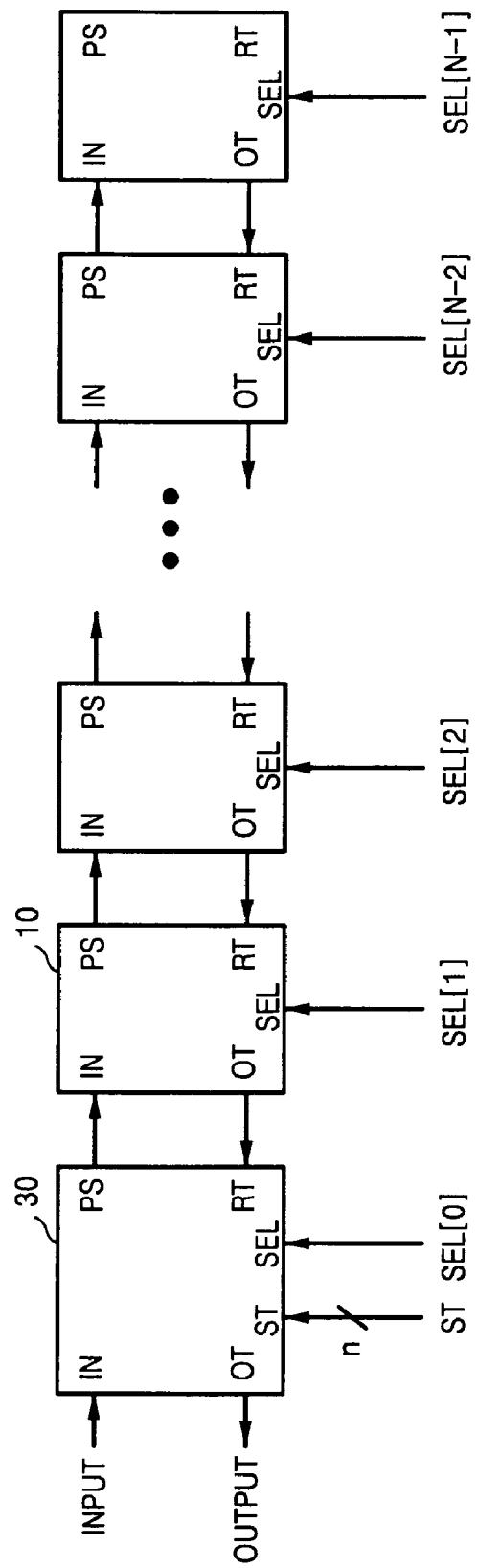
FIG. 5 is a block diagram of a delay line according to some embodiments of the present invention.

FIG. 5 is a block diagram of a delay line according to some embodiments of the present invention. Referring to FIG. 5, in the delay line, a delay cell 30 illustrated in FIG. 3 is included in a first stage of the delay line, and the delay cells 10 illustrated in FIG. 2 are included after the delay cell 30. As compared to the conventional delay line of FIG. 1, the delay cell 30, having a controllable step delay, is further included in the first stage of the delay line of FIG. 5, thereby allowing control of a delay step of the delay line.

Figure 6:
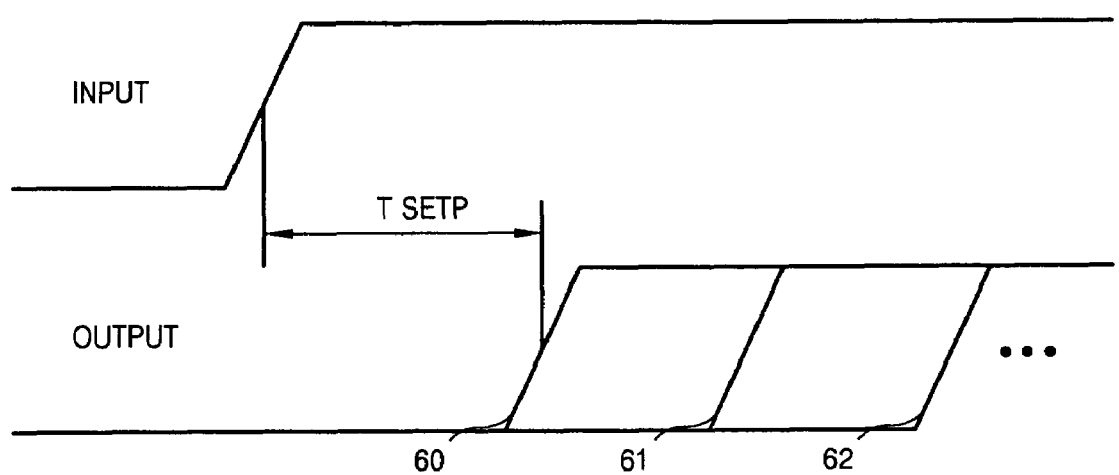
FIG. 6 is a timing diagram illustrating operation of a conventional delay line.
Figure 7:
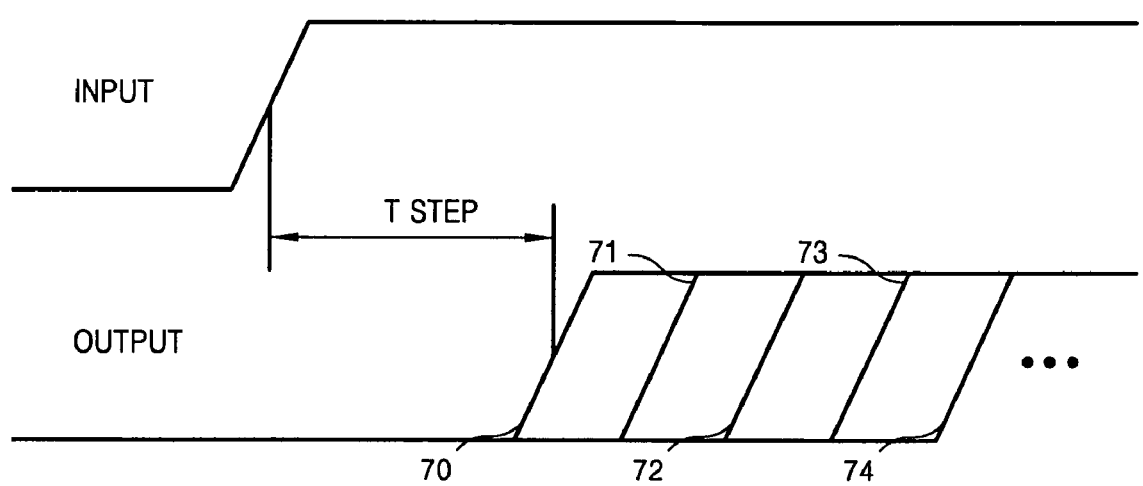
FIG. 7 is a timing diagram illustrating an output of a delay line, when a 1-bit signal is input to an ST terminal, according to some embodiments of the present invention.
Figure 8:
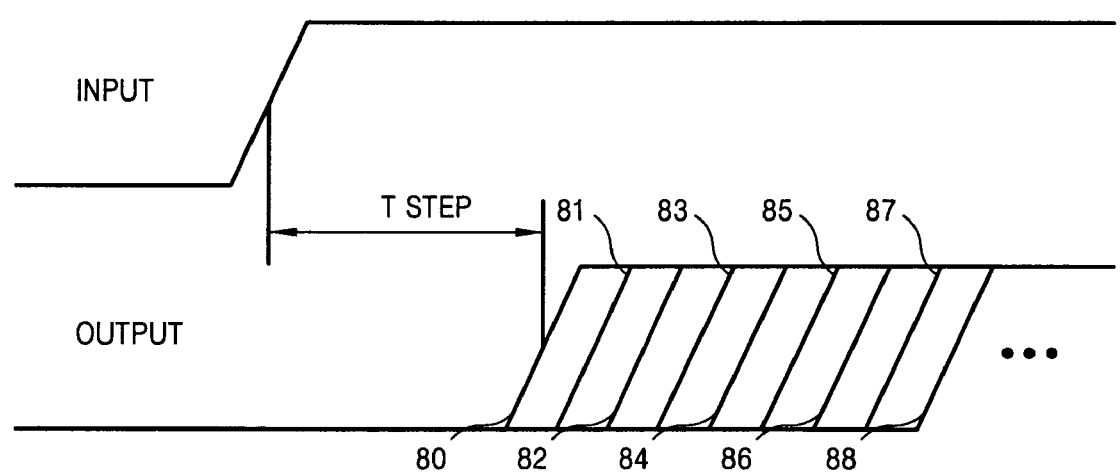
FIG. 8 is a timing diagram illustrating an output of a delay line, when a 2-bit signal is input an ST terminal, according to some embodiments of the present invention.

FIGS. 6 through 8 are timing diagrams comparing outputs of a conventional delay line and a delay line according to some embodiments of the present invention. FIG. 6 illustrates an output for a conventional delay line. More particularly, FIG. 6 illustrates a result of delaying an input signal INPUT to a delay line according to an input SEL[0:N−1] to a SEL terminal. Reference numerals 60, 61, and 62, respectively, denote cases where values of 001, 010, and 100 are input to the SEL terminal. Referring to FIG. 6, delay cells are sequentially activated in response to a signal SEL, thereby delaying data transmission by T step.

FIG. 7 is a diagram illustrating an output of a delay line when a 1-bit signal is input to an ST terminal according to some embodiments of the present invention. Reference numerals 70, 72, and 74, respectively, denote a case where ST=0 and a value of 001 is input to an SEL terminal, a case where ST=0 and a value of 010 is input to the SEL terminal, and a case where ST=0 and a value of 100 is input to the SEL terminal. Reference numerals 71 and 73, respectively, denote a case where ST=1 and a value of 001 is input to the SEL terminal, and a case where ST=1 and a value of 010 is input to the SEL terminal.

Referring to FIG. 7, if ST=0, a step delay is T step, and, if ST=1, a step delay is T step×3/2 as shown in Table 1. Accordingly, it is possible to control a step delay by controlling a signal ST and a signal SEL applied to a delay line according to some embodiments of the present.

FIG. 8 is a diagram illustrating an output of a delay line when a 2-bit signal is input to an ST terminal according to some embodiments of the present invention. Reference numerals 80, 84, and 88, respectively, denote a case where ST=00 and a value of 001 is input to an SEL terminal, a case where ST=00 and a value of 010 is input to the SEL terminal, and a case where ST=00 and a value of 100 is input to the SEL terminal. Reference numerals 81 and 85, respectively, denote a case where ST=01 and a value of 001 is input to the SEL terminal and a case where ST=01 and a value of 010 is input to the SEL terminal. Reference numerals 82 and 86, respectively, denote a case where ST=10 and a value of 001 is input to the SEL terminal and a case where ST=10 and a value of 010 is input to the SEL terminal. Reference numerals 83 and 87, respectively, denote a case where ST=11 and a value of 001 is input to the SEL terminal and a case where ST=11 and a value of 010 is input to the SEL terminal.

Referring to FIG. 8, as shown in Table 1, if ST=00, a step delay is T step, and if ST=01, a step delay is T step×5/4, if ST=10, a step is T step×6/4, and if ST=11, a step delay is T step×7/4. Accordingly, it is possible to control a step delay by controlling a signal ST and a signal SEL applied to a delay line according to some embodiments of the present invention.

According to some embodiments of the present invention, a step delay in a delay cell is controlled in response to a predetermined control signal, and a delay cell that controls a step delay is included in a delay line. In some embodiments, this may allow slowing control of a delay step according to the data processing speed of an apparatus to which the delay line is applied.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A delay line, comprising:
   an adjustable delay cell that adjusts a speed at which an input signal to the adjustable delay cell is transmitted through the adjustable delay cell responsive to a control signal; and
   a plurality of set delay cells coupled in series with the adjustable delay cell that delay transmission through the set delay cells of an input signal to the respective set delay cells an amount that does not vary responsive to the control signal;
   wherein the adjustable delay cell comprises:
   a buffer that adjusts the speed at which the input signal to the adjustable delay cell is transmitted responsive to the control signal; and
   a multiplexer that selects and outputs an output of the buffer or a second input signal, responsive to a select signal; and
   wherein the buffer comprises:
   a first inverter that inverts the input signal to the adjustable delay cell;
   a driver that directly receives the input signal to the adjustable delay cell and outputs a signal having the same value as a value of the inverted signal output from the first inverter when activated by the control signal; and
   a second inverter that has an input coupled to the output signal of the driver and the signal output from the first inverter that inverts the input signal of the second inverter and wherein the output signal of the second inverter is generated at a rate that is greater when the driver is activated by the control signal.

2. The delay line of claim 1, wherein the adjustable delay cell comprises a first delay cell of the delay line and wherein an output of the adjustable delay cell is provided as a next input signal to a first of the plurality of set delay cells and wherein the plurality of set delay cells delay the next input signal received from the adjustable delay cell for a predetermined length of time and output the delayed signal.

3. The delay line of claim 1, wherein the driver comprises:
   a third inverter that receives the input signal to the adjustable delay cell and outputs the signal having the same value as the value of the signal output from the first inverter; and a switch that activates the third inverter responsive to the control signal to activate the driver;

wherein a length of time required to transmit the input signal to the adjustable delay cell through the adjustable delay cell is greater when the driver is not activated than when the driver is activated.

4. The delay line of claim 3, wherein the switch comprises:
a PMOS transistor having a control gate coupled to the control signal; and
an NMOS transistor having a control gate coupled at an inverted signal of the control signal.

5. The delay line of claim 1, wherein the control signal comprises a plurality of bits and wherein the buffer comprises a plurality of drivers connected to respective ones of the plurality of bits of the control signal.

6. A delay line, comprising:
an adjustable delay cell that adjusts a speed at which an input signal to the adjustable delay cell is transmitted through the adjustable delay cell responsive to a control signal; and
a plurality of set delay cells coupled in series with the adjustable delay cell that delay transmission through the set delay cells of an input signal to the respective set delay cells an amount that does not vary responsive to the control signal;
wherein the adjustable delay cell comprises:
a buffer that adjusts the speed at which the input signal to the adjustable delay cell is transmitted responsive to the control signal; and
a multiplexer that selects and outputs an output of the buffer or a second input signal, responsive to a select signal; and
wherein the control signal comprises a plurality of bits and wherein the buffer comprises a plurality of drivers connected to respective ones of the plurality of bits of the control signal that directly receives the input signal to the adjustable delay cell and wherein each of the plurality of drivers inverts the input signal to the adjustable delay cell and outputs the inverted signal responsive to its respective one of the bits of the control signal.

7. The delay line of claim 6, wherein the buffer further comprises:
a first inverter that inverts the input signal to the adjustable delay cell and outputs the inverted signal to an inversion output node; and
a second inverter that inverts the signal on the inversion output node;
wherein each of the plurality of drivers comprises:
a first transistor and a second transistor connected in series between a first supply voltage source and the inversion output node; and
a third transistor and a fourth transistor connected in series between the inversion output node and a second supply voltage source;
wherein the first and fourth transistors are activated responsive to the input signal to the adjustable delay cell and the second and third transistors are activated responsive to each drivers respective one of the plurality of bits of the control signal.

8. The delay line of claim 7, wherein the second supply voltage comprises a ground reference.

9. A delay cell, comprising:
a buffer that adjusts a length of time required to transmit an input signal of the delay cell through the delay cell responsive to a control signal; and
a multiplexer that selects and outputs an output of the buffer or a second input signal responsive to a select signal;
wherein the buffer comprises:
a first inverter that inverts the input signal of the delay cell and outputs the inverted signal;
a driver that directly receives and inverts the input signal of the delay cell and outputs the inverted signal responsive to the control signal; and
a second inverter having an input coupled to the output of the first inverter and the driver that inverts the input to the second inverter.

10. The delay cell of claim 9, wherein the driver comprises:
a third inverter that inverts the input signal of the delay cell and outputs the inverted signal; and
a switch that activates the third inverter responsive to the control signal;
wherein a length of time required to transmit the input signal of the delay cell through the delay cell when the third inverter is not activated is greater than when the third inverter is activated.

11. The delay cell of claim 10, wherein the switch comprises:
a PMOS transistor having a control gate coupled to the control signal; and
an NMOS transistor having a control gate coupled at an inverted signal of the control signal.

12. The delay cell of claim 9, wherein the control signal comprises a plurality of bits and wherein the buffer comprises a plurality of drivers connected to respective ones of the plurality of bits of the control signal.

13. The delay cell of claim 9, wherein the control sign a comprises a plurality of bits and wherein the buffer comprises a plurality of drivers connected to respective ones of the plurality of bits of the control signal that receive the input signal to the adjustable delay cell and wherein each of the plurality of drivers inverts the input signal to the delay cell and outputs the inverted signal responsive to its respective one of the bits of the control signal.

14. The delay cell of claim 13, wherein the buffer further comprises:
a first inverter that inverts the input signal to the delay cell and outputs the inverted signal to an inversion output node; and
a second inverter that inverts the signal on the inversion output node;
wherein each of the plurality of drivers comprises:
a first transistor and a second transistor connected in series between a first supply voltage source and the inversion output node; and
a third transistor and a fourth transistor connected in series between the inversion output node and a second supply voltage source;
wherein the first and fourth transistors are activated responsive to the input signal to the delay cell and the second and third transistors are activated responsive to each drivers respective one of the plurality of bits of the control signal.

* * * * *